(12) United States Patent
Chen et al.

(10) Patent No.: US 9,754,910 B2
(45) Date of Patent: Sep. 5, 2017

(54) METHODS OF PACKAGING SEMICONDUCTOR DEVICES AND PACKAGED SEMICONDUCTOR DEVICES

(71) Applicant: Taiwan Semiconductor Manufacturing Company, Ltd., Hsin-Chu (TW)

(72) Inventors: Jie Chen, New Taipei (TW); Hsien-Wei Chen, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 345 days.

(21) Appl. No.: 14/297,430

(22) Filed: Jun. 5, 2014

(65) Prior Publication Data

US 2015/0357317 A1 Dec. 10, 2015

(51) Int. Cl.
*H01L 23/00* (2006.01)
*H01L 23/58* (2006.01)
(Continued)

(52) U.S. Cl.
CPC .......... *H01L 24/17* (2013.01); *H01L 23/5389* (2013.01); *H01L 23/544* (2013.01); *H01L 23/585* (2013.01); *H01L 24/19* (2013.01); *H01L 24/20* (2013.01); *H01L 25/105* (2013.01); *H01L 25/50* (2013.01); *H01L 21/561* (2013.01); *H01L 23/3128* (2013.01); *H01L 23/49816* (2013.01); *H01L 24/05* (2013.01); *H01L 24/06* (2013.01); *H01L 24/13* (2013.01); *H01L 24/16* (2013.01); *H01L 24/94* (2013.01); *H01L 25/0657* (2013.01); *H01L 2223/54426* (2013.01); *H01L 2224/04105* (2013.01); *H01L 2224/05124* (2013.01); *H01L 2224/05147* (2013.01); *H01L 2224/06181* (2013.01); *H01L 2224/12105* (2013.01); *H01L 2224/131* (2013.01);
(Continued)

(58) Field of Classification Search
CPC .. G01R 27/03; G01R 29/0878; G01R 1/0416; H01L 24/17; H01L 21/561
USPC ................... 324/750.02, 500, 762.01–762.1, 324/750.01–750.25, 754.03, 324/755.01–755.11; 257/48, 499, 621, 257/685
See application file for complete search history.

(56) References Cited

U.S. PATENT DOCUMENTS 6,133,627 A * 10/2000 Khandros ........... H01L 21/6836
257/692
7,642,133 B2 * 1/2010 Wu ......................... H01L 21/56
257/686
(Continued)

*Primary Examiner* — Vincent Q Nguyen
*Assistant Examiner* — Trung Nguyen
(74) *Attorney, Agent, or Firm* — Slater Matsil, LLP

(57) ABSTRACT

Methods of packaging semiconductor devices and packaged semiconductor devices are disclosed. In some embodiments, a method of packaging a semiconductor device includes providing a semiconductor device comprising an integrated circuit die, connectors disposed over the integrated circuit die, and an insulating material disposed over the connectors and the integrated circuit die. The insulating material is removed from over corner regions of the integrated circuit die, and a molding material is disposed over the insulating material and the integrated circuit die. A top portion of the molding material and the insulating material is removed to expose the connectors.

20 Claims, 10 Drawing Sheets

(51) Int. Cl.
  *H01L 23/544* (2006.01)
  *H01L 23/538* (2006.01)
  *H01L 25/10* (2006.01)
  *H01L 25/00* (2006.01)
  *H01L 23/31* (2006.01)
  *H01L 21/56* (2006.01)
  *H01L 25/065* (2006.01)
  *H01L 23/498* (2006.01)

(52) U.S. Cl.
  CPC ............ *H01L 2224/13111* (2013.01); *H01L 2224/13116* (2013.01); *H01L 2224/13139* (2013.01); *H01L 2224/13147* (2013.01); *H01L 2224/16113* (2013.01); *H01L 2224/16227* (2013.01); *H01L 2224/2919* (2013.01); *H01L 2224/32145* (2013.01); *H01L 2224/32225* (2013.01); *H01L 2224/48091* (2013.01); *H01L 2224/48227* (2013.01); *H01L 2224/73104* (2013.01); *H01L 2224/73265* (2013.01); *H01L 2224/73267* (2013.01); *H01L 2224/94* (2013.01); *H01L 2225/0651* (2013.01); *H01L 2225/06568* (2013.01); *H01L 2225/1035* (2013.01); *H01L 2225/1041* (2013.01); *H01L 2225/1058* (2013.01); *H01L 2924/01322* (2013.01); *H01L 2924/15311* (2013.01); *H01L 2924/181* (2013.01)

(56) References Cited

U.S. PATENT DOCUMENTS

2008/0057610 A1* 3/2008 Lee ............... H01L 21/0337
  438/52
2008/0286990 A1* 11/2008 Hiew ............. H01L 21/565
  439/55

* cited by examiner

METHODS OF PACKAGING SEMICONDUCTOR DEVICES AND PACKAGED SEMICONDUCTOR DEVICES

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon.

Dozens or hundreds of integrated circuits are typically manufactured on a single semiconductor wafer. The individual dies are singulated by sawing the integrated circuits along a scribe line. The individual dies are then packaged separately, in multi-chip modules, or in other types of packaging, for example.

The semiconductor industry continues to improve the integration density of various electronic components (e.g., transistors, diodes, resistors, capacitors, etc.) by continual reductions in minimum feature size, which allow more components to be integrated into a given area. These smaller electronic components such as integrated circuit dies also require smaller packages that utilize less area than packages of the past, in some applications.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
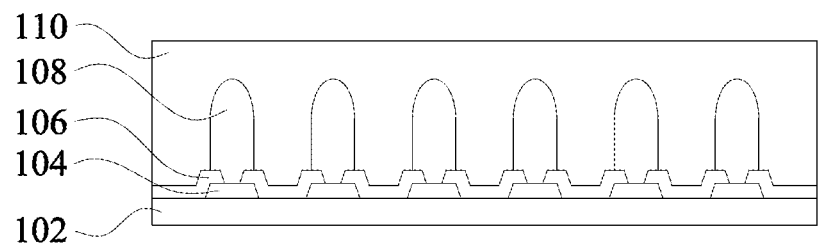
FIG. 1 is a cross-sectional view of a semiconductor device that will be packaged in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of the present disclosure provide novel methods of packaging semiconductor devices and structures thereof, wherein an insulating material is removed from corner regions of an integrated circuit die so that a molding material can cover the corner regions during a packaging process, which reduces warpage of the integrated circuit die and protects the corner regions during a subsequent grinding process.

Figure 2:
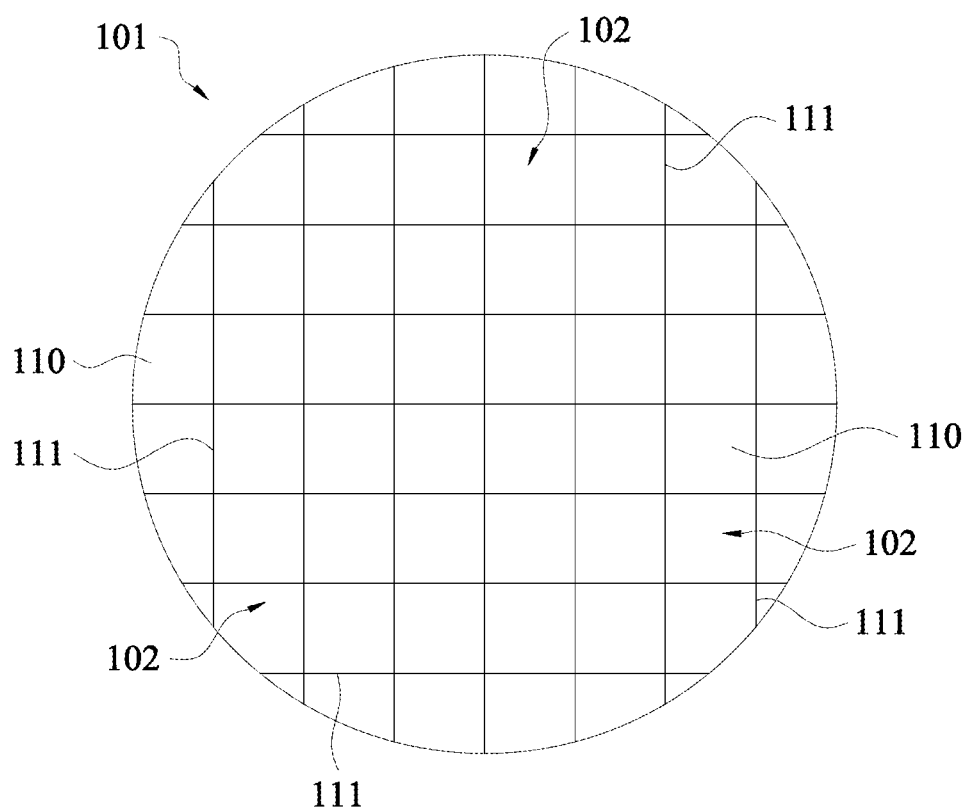
FIG. 2 is a top view of a wafer that includes a plurality of the semiconductor devices shown in FIG. 1.

FIG. 1 is a cross-sectional view of a semiconductor device that will be packaged in accordance with some embodiments of the present disclosure. To package the semiconductor device, first, the semiconductor device is provided. The semiconductor device includes an integrated circuit die 102. The integrated circuit die 102 may be previously fabricated on a semiconductor wafer 101, as shown in FIG. 2, which is a top view of a wafer 101 that includes a plurality of the semiconductor devices shown in FIG. 1. The integrated circuit die 102 includes a semiconductor substrate with circuitry, components, wiring, and other elements (not shown) fabricated within and/or thereon. The integrated circuit die 102 is adapted to perform a predetermined function or functions, such as logic, memory, processing, other functions, or combinations thereof, as example.

The semiconductor device shown in FIG. 1 includes a plurality of contact pads 104 formed across a top surface thereof. The plurality of contact pads are disposed on the integrated circuit die 102. The contact pads 104 comprise a conductive material such as copper, aluminum, other metals, or alloys or multiple layers thereof, as examples. Alternatively, the contact pads 104 may comprise other materials.

An insulating material 106 is disposed over exposed top surfaces of the integrated circuit die 102 and over portions of the contact pads 104. The insulating material 106 may comprise one or more insulating material layers, such as silicon dioxide, silicon nitride, a polymer material, or other materials. The insulating material 106 is patterned using a photolithography process to form openings over a top surface of the contact pads 104.

A plurality of connectors 108 is disposed over the integrated circuit die 102. Each of the plurality of connectors 108 is coupled to one of the plurality of contact pads 104 disposed on the integrated circuit die 102. The connectors 108 are coupled to the contact pads 104 through the openings in the insulating material 106. The connectors 108 comprise a conductive material, and may comprise a metal in some embodiments. In some embodiments, the connectors 108 comprise pillars that extend from a top surface of each contact pad 104. The plurality of connectors comprises a plurality of pillars in some embodiments, for example. The connectors 108 may comprise a height of about 10 μm to about 30 μm and a width of about 15 μm to about 80 μm. The connectors 108 may be spaced apart by about 20 μm to about 100 μm. Alternatively, the connectors 108 may comprise other dimensions and other relative dimensions. In some embodiments, the connectors 108 comprise copper or a copper alloy. The connectors 108 may alternatively comprise other materials.

The connectors 108 may be formed using a subtractive etch process, by depositing a conductive material over the entire integrated circuit die 102 top surface over the insulating material 104 and exposed top surfaces of the contact pads 104, and patterning the conductive material using a photolithography process to form the connectors 108. Alternatively, the connectors 108 may be formed using a plating process, by depositing a seed layer (not shown) over the entire integrated circuit die 102 top surface over the insulating material 104 and exposed top surfaces of the contact pads 104, and then depositing a sacrificial material such as a photoresist over the seed layer. The sacrificial material is patterned using photolithography, and then a conductive material is plated onto the seed layer through the patterned sacrificial material. The sacrificial material is removed, and portions of the seed layer left remaining over the insulating material 104 are removed using an etch process. Alternatively, the connectors 108 may be formed using other methods.

The plurality of connectors 108 are also referred to herein, e.g., in some of the claims, as a plurality of first connectors 108. The plurality of connectors 108 are disposed on a first side of the integrated circuit die 102, wherein the first side comprises a top side of the integrated circuit die 102 in the view shown in FIG. 1.

An insulating material 110 is formed over the connectors 108 and the integrated circuit die 102, also shown in FIG. 1. The insulating material 110 comprises a polymer such as polybenzoxazole (PBO), polybenzobisoxazole, or polyimide in some embodiments, as examples. Alternatively, the insulating material 110 may comprise other materials.

Referring again to FIG. 2, a top view of a wafer 101 is illustrated that includes a plurality of the integrated circuit dies 102 shown in FIG. 1 formed thereon. The insulating material 110 is formed over the top surface of the integrated circuit dies 102. In accordance with some embodiments, the plurality of integrated circuit dies 102 is later singulated along scribe line regions 111 to form a plurality of single, separated integrated circuit dies 102.

Figure 3:
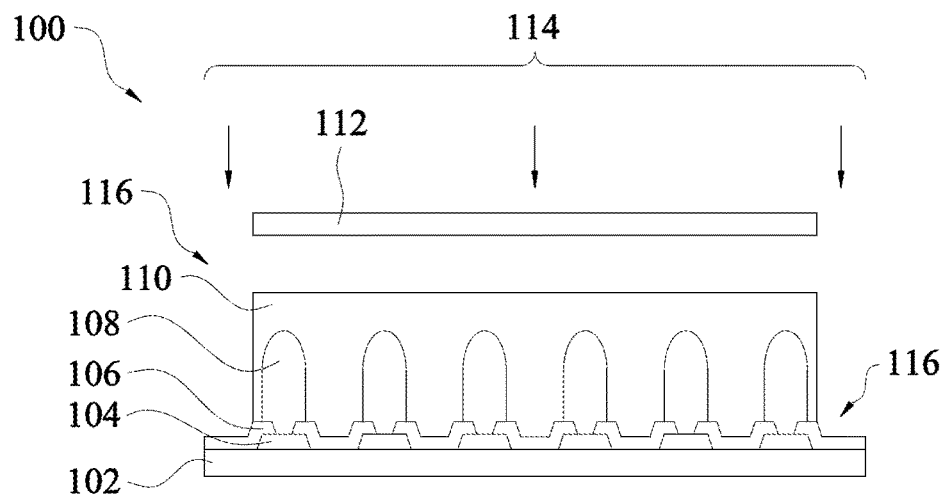
FIGS. 3 through 6 are cross-sectional views illustrating a method of packaging a semiconductor device in accordance with some embodiments.

FIGS. 3 through 6 are cross-sectional views illustrating a method of packaging a semiconductor device in accordance with some embodiments. A packaged semiconductor device 100 at various stages of the packaging process is shown. While the integrated circuit dies 102 are still in wafer 101 form as shown in FIG. 2, the insulating material 110 is removed from corner regions 116 of each integrated circuit die 102, in accordance with some embodiments of the present disclosure, as shown in FIG. 3. The insulating material 110 is removed from the corner regions 116 using a photolithography process in some embodiments. For example, a layer of photoresist (not shown) may be deposited over the insulating material 110, and the layer of photoresist is patterned by exposing the photoresist to light or energy reflected from or transmitted through a lithography mask 112 having a desired pattern thereon. The photoresist is developed, and exposed (or unexposed, depending on whether the photoresist comprises a positive or negative photoresist) portions of the photoresist are ashed or removed. The photoresist is then used as an etch mask during an etch process 114 for the insulating material 110, as shown in FIG. 3. The photoresist is then removed.

The insulating material 110 removed in corner regions 116 of the integrated circuit dies 110 may comprise a variety of shapes, to be described further herein. A top view of the insulating material 110 that has been patterned to remove the insulating material 110 in the corner regions 116 is shown in FIGS. 10 through 14, which also will be described further herein.

Figure 4:
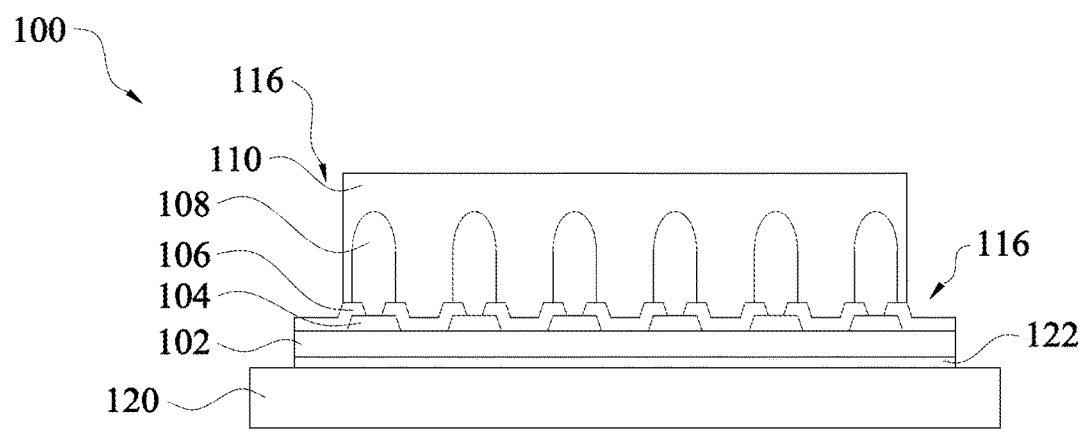

The integrated circuit dies 102 are then singulated along scribe lines 111 to form individual dies 102, and one or more of the integrated circuit dies 102 is then coupled to a carrier 120, manually or using an automated machine such as a pick-and-place machine, as shown in FIG. 4. The integrated circuit die 102 is coupled to the carrier 120 using an adhesive or a die attach film (DAF) 122. The carrier 120 may comprise glass, silicon oxide, aluminum oxide, or a semiconductor wafer, as examples. The carrier 120 may also comprise other materials.

In some embodiments, one integrated circuit die 102 is coupled to the carrier 120 and is packaged. In other embodiments, two or more integrated circuit dies 102 is coupled to the carrier 120 and are packaged together. A plurality of integrated circuit dies 102 comprising the same or different functions may be packaged together in accordance with some embodiments, for example.

Figure 5:
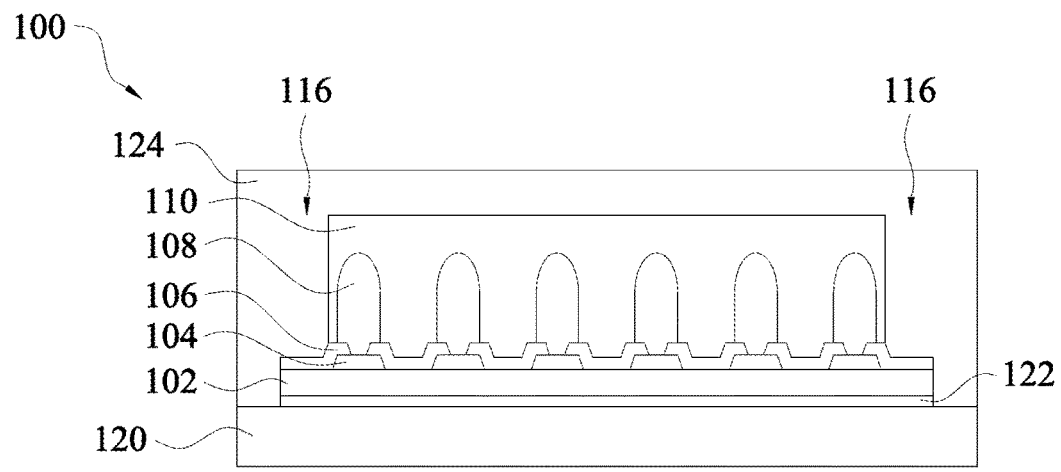

A molding material 124 is then disposed over the insulating material 110 and the integrated circuit die 102, as shown in FIG. 5. The molding material 124 is disposed over the corner regions 116 of the integrated circuit die 102. The molding material 124 is disposed around the integrated circuit die 102 in regions over the carrier 120 proximate the sidewalls of the integrated circuit die 102. The molding material 124 is formed over exposed portions of the carrier 120, the sidewalls of the integrated circuit die 102, exposed portions of the insulating material 106, and the sidewalls and top surfaces of the insulating material 110.

The molding material 124 may be molded using, for example, compressive molding, transfer molding, or other methods. The molding material 124 encapsulates the integrated circuit dies 102, for example. The molding material 124 may comprise an epoxy, an organic polymer, or a polymer with or without a silica-based or glass filler added, as examples. In some embodiments, the molding material 124 comprises a liquid molding compound (LMC) that is a gel type liquid when applied. Alternatively, the molding material 124 may comprise other insulating and/or encapsulating materials.

In some embodiments, the molding material 124 is applied so that it extends over top surfaces of the integrated circuit dies 102, as shown in FIG. 5. Alternatively, the molding material 124 may be applied so that the molding material 124 top surface is substantially coplanar with the top surface of the integrated circuit die 102 in some embodiments, for example. In other embodiments, the molding material 124 may be applied so that the molding material 124 top surface is lower than the top surface of the integrated circuit die 102.

Next, the molding material 124 is cured using a curing process in some embodiments. The curing process may comprise heating the molding material 124 to a predetermined temperature for a predetermined period of time, using an anneal process or other heating process. The curing process may also comprise an ultra-violet (UV) light exposure process, an infrared (IR) energy exposure process, combinations thereof, or a combination thereof with a heating process. Alternatively, the molding material 124 may be cured using other methods. In some embodiments, a curing process is not included.

Figure 6:
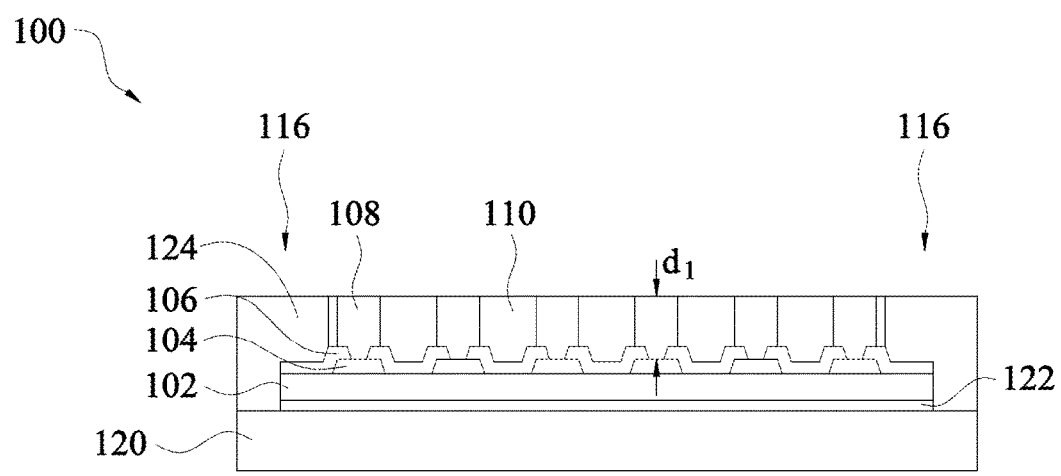

A top portion of the molding material 124 and the insulating material 110 is removed to expose the plurality of connectors 108, as shown in FIG. 6. In some embodiments, a top portion of the molding material 124, the insulating material 110, and the plurality of connectors 108 is removed. The top portion of the molding material 124, the insulating material 110, and the plurality of connectors 108 is removed using a grinding process in some embodiments, for example. The grinding process may comprise a process similar to a sanding process that is used for wood, using a rotating sander, for example. The grinding process may comprise rotating a disk lined with an appropriate material or materials for grinding the materials of the molding material 124, the insulating material 110, and the plurality of connectors 108 to a predetermined height, for example. The disk may be lined with diamond, for example. In some embodiments, the grinding process may comprise a chemical-mechanical polishing (CMP) process, for example. Alternatively, the top portion of the molding material 124, the insulating material 110, and the plurality of connectors 108 may be removed using other methods.

In some embodiments, the connectors 108 after the grinding process comprise a height comprising dimension $d_1$, wherein dimension $d_1$ comprises about 8 μm to about 20 μm. Alternatively, dimension $d_1$ may comprise other values.

The top surfaces of the connectors 108 after the grinding process are exposed and comprise a substantially smooth surface which provides a suitable surface for making electrical contact to. The molding material 124 disposed over the corner regions 116 advantageously prevents or reduces warpage and damage to the underlying integrated circuit die 102 in the corner regions 116 during the grinding process.

Figure 7:
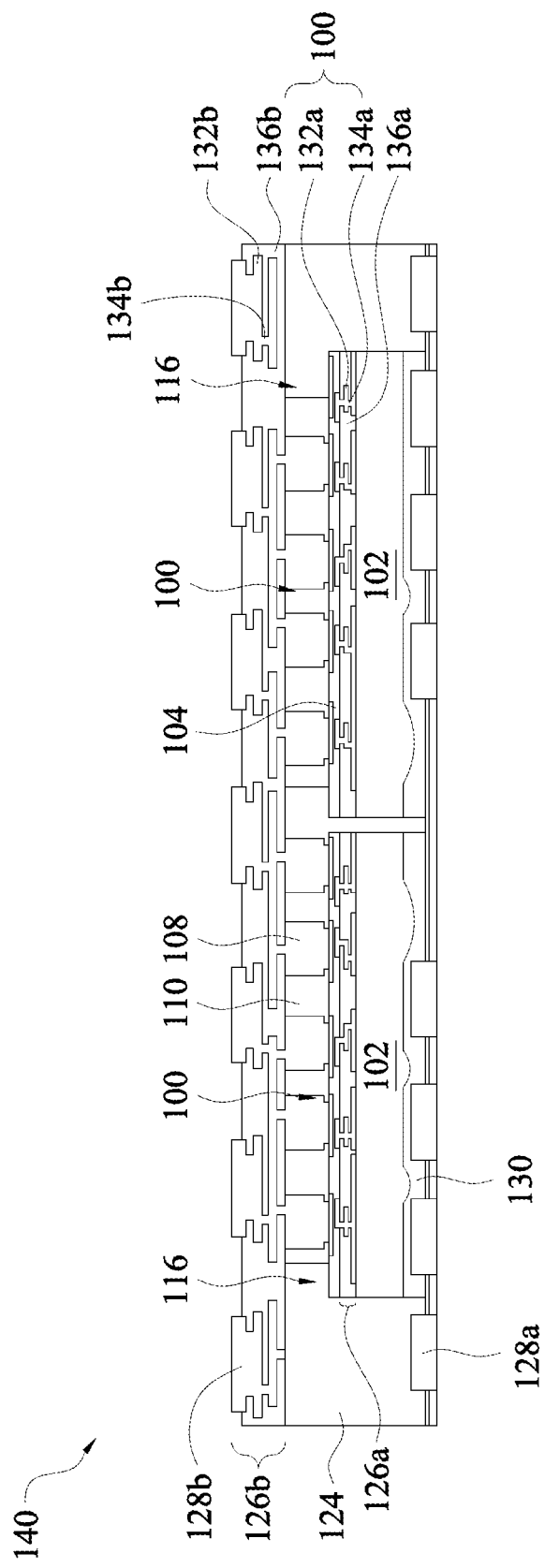
FIGS. 7 and 8 are cross-sectional views illustrating a method of packaging semiconductor devices in accordance with some embodiments.
Figure 8:
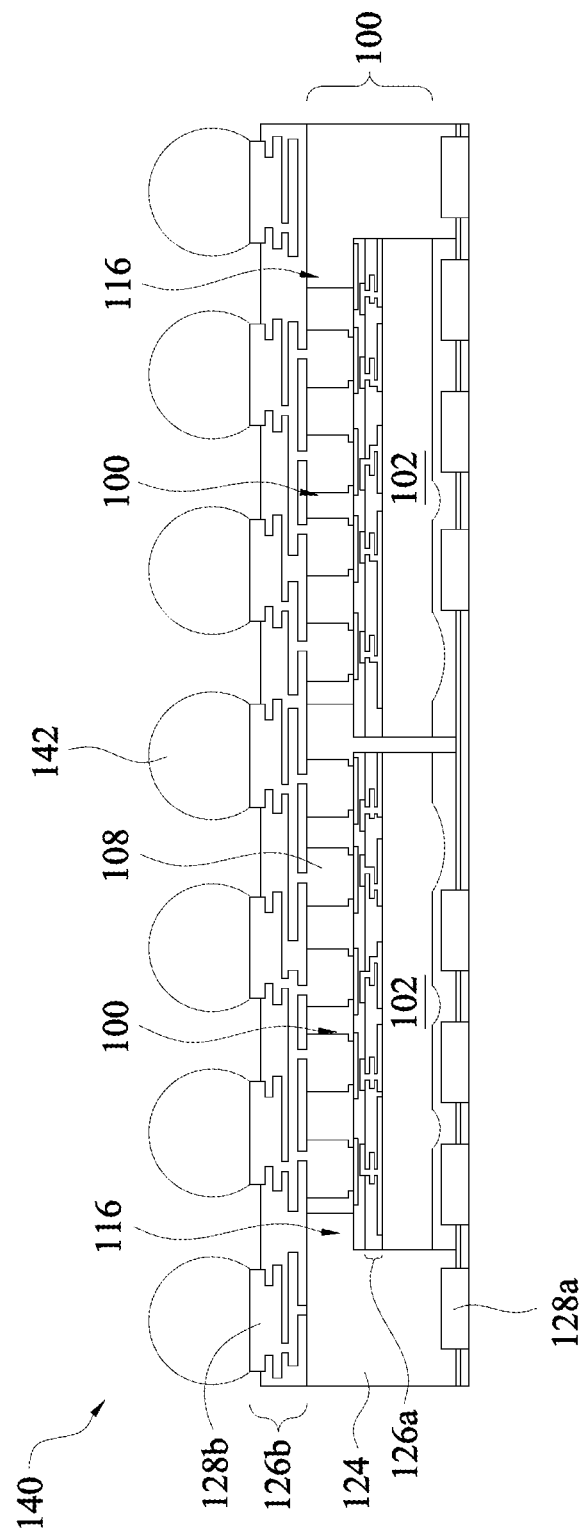

FIGS. 7 and 8 are cross-sectional views illustrating a method of packaging semiconductor devices in accordance with some embodiments. Two integrated circuit dies 102 are packaged together in the embodiments shown. An interconnect structure 126a of the integrated circuit dies 102 disposed proximate a top region of the integrated circuit dies 102 is also shown. The interconnect structures 126a include a plurality of conductive lines 132a and vias 134a disposed within one or more insulating material layers 136a. The interconnect structures 126a may comprise redistribution layers (RDLs), post-passivation interconnect (PPI) structures, or other types of wiring, as examples. The contact pads 104 are coupled to portions of the interconnect structure 126a, e.g. to conductive lines 132a, vias 134a, or other portions of the interconnect structure 126a.

After the packaging steps shown in FIGS. 4 through 6 wherein two integrated circuit dies 102 are coupled to a carrier 120 (FIG. 4), a molding material 124 is formed over both integrated circuit dies 102 (FIG. 5), and the packaged semiconductor device 100 is grinded (FIG. 6), an interconnect structure 126b is formed over the molding material 124 and the integrated circuit dies 102, as shown in FIG. 7. The interconnect structure 126b is formed over the molding material 124, the connectors 108, and the insulating material 110.

The interconnect structure 126b may comprise an RDL, PPI, or other types of wiring. The interconnect structure 126b includes a plurality of conductive lines 132b and vias 134b disposed within one or more insulating material layers 136b. The interconnect structure 126b includes contact pads 128b disposed proximate a top surface thereof. Portions of the interconnect structure 126b are coupled to the plurality of connectors 108. For example, the conductive lines 132b, vias 134b, or other portions of the interconnect structure 126b may be coupled to the connectors 108.

Contact pads 128a may also be disposed on a bottom surface of the packaged semiconductor device 140, e.g., on portions of the integrated circuit dies 102 and the molding material 124. In other embodiments, the contact pads 128a may not be included.

The interconnect structures 126a provide horizontal electrical connections for the integrated circuit dies 102. Likewise, the interconnect structure 126b provides horizontal electrical connections for the packaged semiconductor device 140. In some embodiments, through-vias may be formed in the molding 124 to provide vertical electrical connections for the packaged semiconductor device 140 (not shown in FIGS. 7 and 8; see through-vias 166 shown in FIG. 9).

In some embodiments, connectors 142 are coupled to the contact pads 128b disposed on the top surface of the interconnect structure 126b, as shown in FIG. 8. For example, the plurality of connectors 108 may comprise a plurality of first connectors 108, and a plurality of second connectors 142 are coupled to the interconnect structure 126b in some embodiments.

The interconnect structure 126b includes fan-out regions in some embodiments. For example, the first connectors 108 may comprise a first footprint, and the second connectors 142 or contact pads 128b may comprise a second footprint, wherein the second footprint is larger than the first footprint. The second connectors 142 are spread farther apart from one another by a greater distance than the first connectors 108 are in some embodiments, for example.

Figure 9:
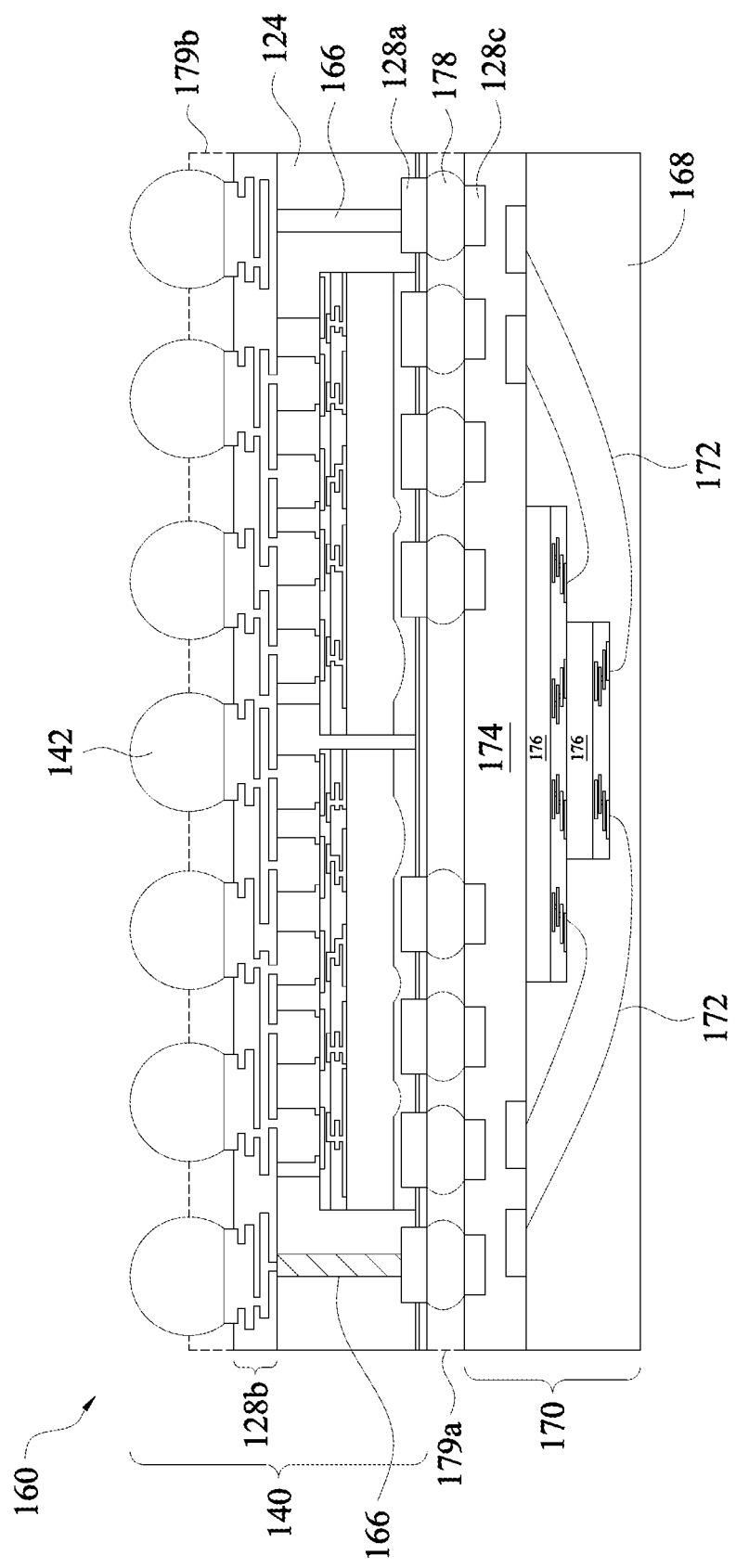
FIG. 9 is a cross-sectional view illustrating a method of packaging semiconductor devices in accordance with some embodiments, wherein a first packaged semiconductor device is coupled to a second packaged semiconductor device.

To package the packaged semiconductor device 140 shown in FIG. 7, the integrated circuit dies 102 may be left coupled to the carrier 120 as shown in FIG. 6, and the interconnect structure 126b may be formed over the molding material 124 and integrated circuit dies 102 with the dies 102 still attached to the carrier 120. The carrier 120 may be removed before or after the connectors 142 are attached, as shown in FIG. 8. The carrier 120 may be removed, and then the contact pads 128a may be formed on the bottom surface of the packaged semiconductor device 140, in some embodiments. Alternatively, the carrier 120 may be removed before the formation of the interconnect structure 126b or the contact pads 128a, in other embodiments. In some embodiments, the carrier 120 is removed, and connectors 178 are coupled to a side of the integrated circuit dies 102, as shown in FIG. 9, wherein the connectors 178 are coupled to a side opposite the side the connectors 108 are disposed on. One or more carriers may be used during the packaging of the semiconductor devices, in some embodiments.

In embodiments wherein the contact pads 128a are included on the bottom surface of the packaged semiconductor device 140, a plurality of connectors 178 may be coupled to the contact pads 128a, and the connectors 178 may be coupled to another packaged semiconductor device. For example, FIG. 9 is a cross-sectional view illustrating a method of packaging semiconductor devices in accordance with some embodiments, wherein a first packaged semiconductor device 140 is coupled to a second packaged semiconductor device 170.

For example, in some embodiments, the plurality of connectors 108 comprises a plurality of first connectors 108, and a packaged semiconductor device 140 shown in FIG. 7 or 8 comprises a first packaged semiconductor device 140. The first packaged semiconductor device 140 is coupled to a second packaged semiconductor device 170 by a plurality of second connectors 178, as shown in FIG. 9.

In some embodiments, an insulating material 179a is disposed between the packaged semiconductor devices 140 and 170 between the connectors 178, as shown in phantom (e.g., in dashed lines) in FIG. 9. An insulating material 179b (also shown in phantom) may be disposed over the interconnect structure 128b between connectors 142. Insulating material 179a may comprise an underfill material, and insulating material 179b may comprise a molding material, as examples. Alternatively, the insulating materials 179a and 179b may comprise other materials, or may not be included.

The packaged semiconductor device 160 shown in FIG. 9 comprises a package-on-a package (PoP) device in accordance with some embodiments. The PoP device 160 includes a packaged semiconductor device 140 described herein that is coupled to a packaged semiconductor device 170.

The packaged semiconductor device 140 includes a plurality of through-vias 166 formed within the molding compound 124. The through-vias 166 provide vertical connections for the packaged semiconductor device 140. Some of the contact pads 128a are coupled to the through-vias 166. The contact pads 128a of the packaged semiconductor device 140 are coupled to contact pads 128c of packaged semiconductor device 170 by conductors 178 which may comprise solder balls or other materials.

Packaged semiconductor device 170 includes one or more integrated circuit dies 176 coupled to a substrate 174. In some embodiments, dies 176 comprises memory chips. For example, dies 176 may comprise dynamic random access memory (DRAM) devices in some embodiments. Alternatively, dies 176 may comprise other types of chips. Wire bonds 172 may be coupled to contact pads on a top surface of the integrated circuit die or dies 176, which are coupled to bond pads on the substrate 174. A molding compound 168 may be disposed over the wire bonds 172, integrated circuit die or dies 176, and the substrate 174.

Alternatively, a PoP device 160 may include two packaged semiconductor devices 140 described herein that are coupled together in some embodiments, not shown in the drawings. In some embodiments, the PoP device 160 may comprise a system-on-a-chip (SOC) device, as another example.

Figure 10:
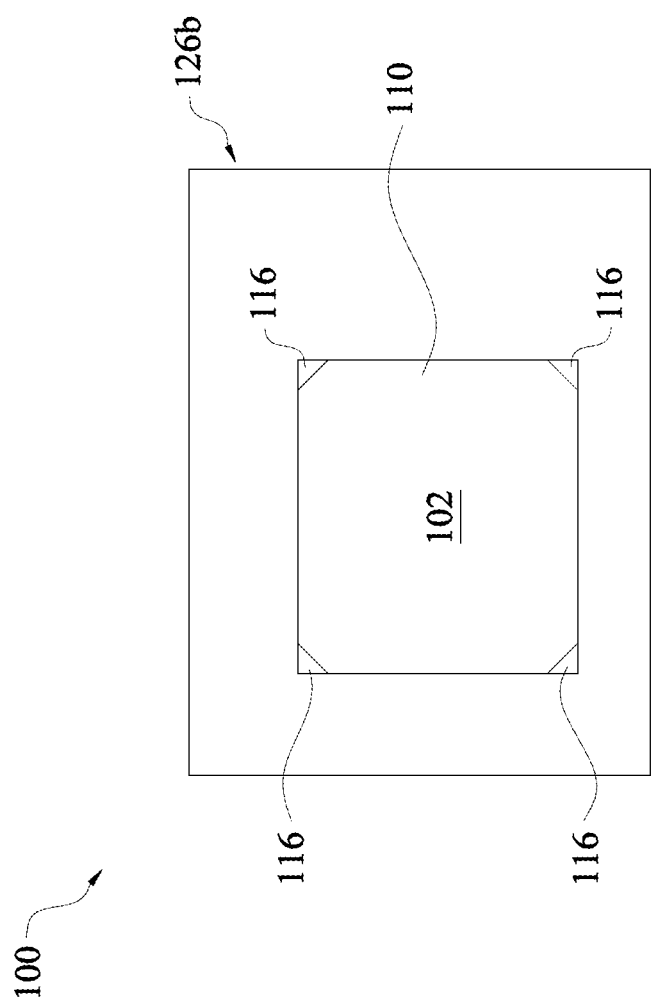
FIGS. 10 and 11 are top views of a portion of a packaged semiconductor device in accordance with some embodiments.

FIGS. 10 through 14 are top views of portions of packaged semiconductor devices described herein in accordance with some embodiments. FIG. 10 illustrates an integrated circuit die 102 wherein the insulating material 110 has been removed in the corner regions 116. The interconnect structure 126b has a wider footprint than connectors (not shown in FIG. 10) on the integrated circuit die 102, and thus the interconnect structure 126b is larger than the integrated circuit die 102. The shape of the corner regions 116 substantially comprises a triangle in the embodiments shown in FIG. 10.

Figure 11:
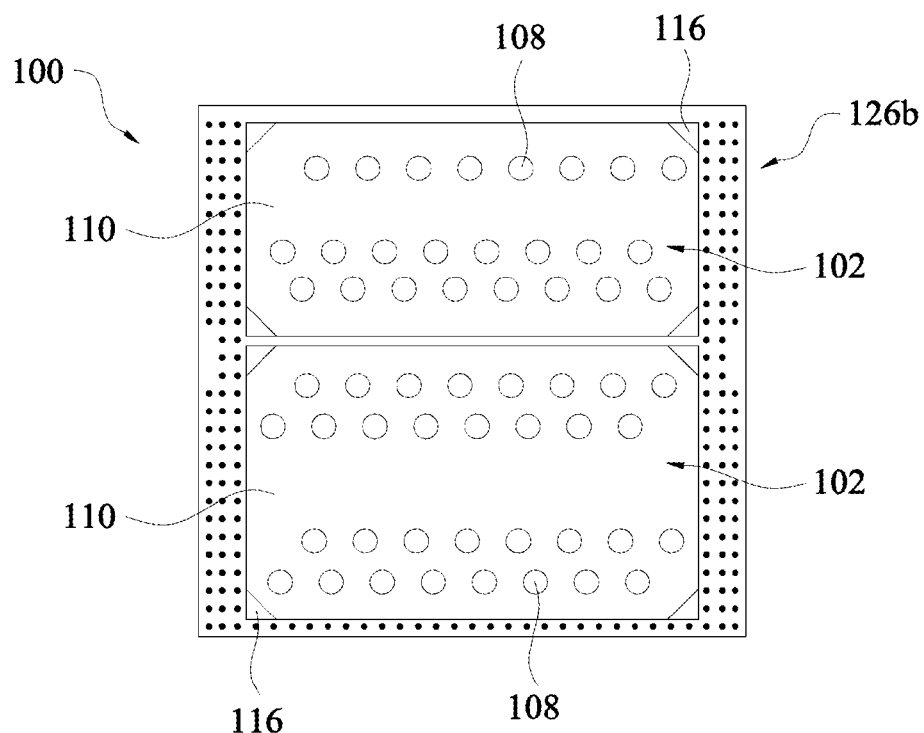

In FIG. 11, two integrated circuit dies 102 are packaged together in a packaged semiconductor device 100. The shape of the corner regions 116 substantially comprises a triangle in the embodiments shown in FIG. 11. A possible lay-out or arrangement for connectors 108 is illustrated. Alternatively, the connectors 108 may be arranged in other patterns.

In FIG. 11, both integrated circuit dies 102 have the insulating material 110 removed in the corner regions 116. In some embodiments, some integrated circuit dies 102 may have the insulating material 110 left remaining in the corner regions 116, not shown in the drawings.

Figure 12:
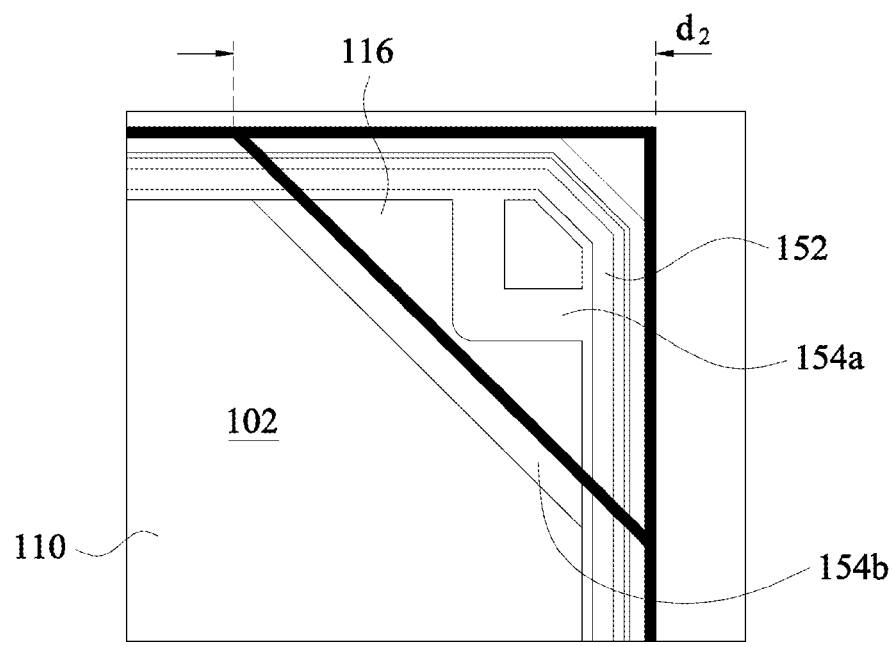
FIGS. 12, 13, and 14 are more detailed top views of corner regions of packaged integrated circuit dies in accordance with some embodiments.
Figure 13:
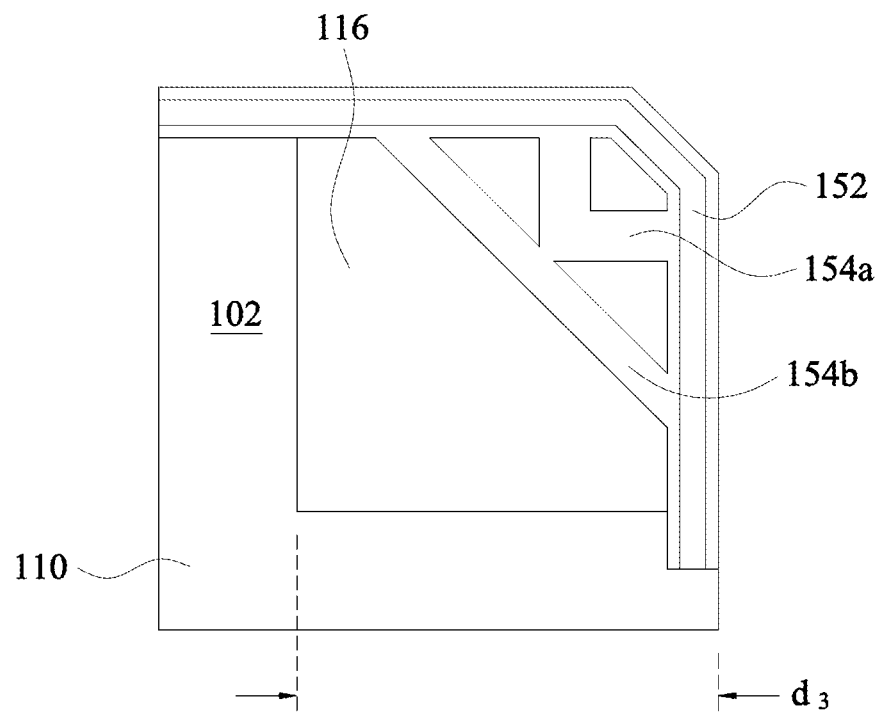
Figure 14:
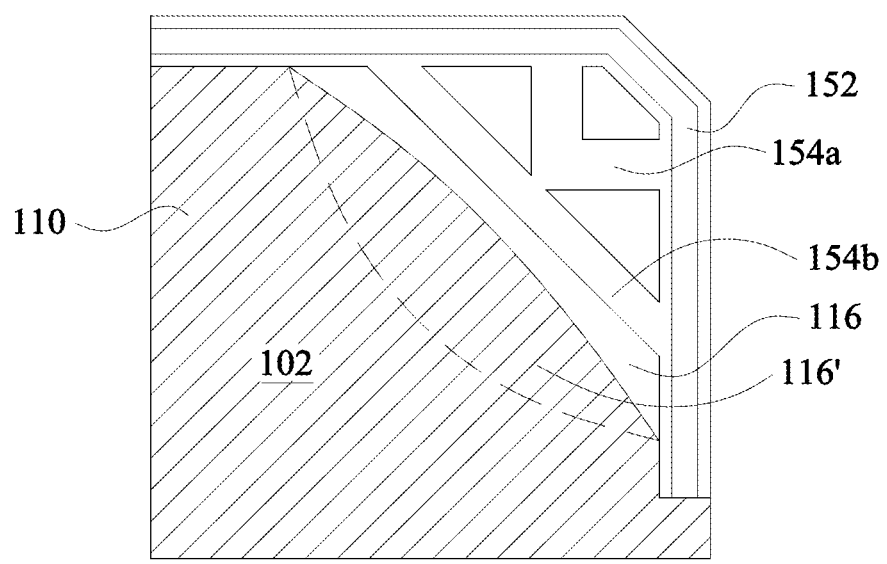

FIGS. 12, 13, and 14 are more detailed top views of corner regions 116 of packaged integrated circuit dies 100 or 140 in accordance with some embodiments, illustrating various shapes of the corner regions 116 wherein the insulating material 110 is removed, and also illustrating various components that may reside within or proximate the corner regions 116. In FIG. 12, the shape of the corner regions 116 substantially comprises a triangle. In some embodiments, the shape of the corner regions comprises an isosceles right triangle. The corner region 116 includes a seal ring 152 and a chip stress relief (CSR) pattern 154a formed therein. A CSR pattern 154b is formed proximate the corner region 116. In some embodiments, the CSR pattern 154a and/or 154b may comprise an alignment mark, for example. The seal ring 152 may comprise a metal ring formed proximate the scribe line region 111 of the integrated circuit die 102, for example. The CSR patterns 154a and 154b may comprise insulating materials, semiconductive materials, and/or conductive materials formed in predetermined shapes to reduce an impact of damage induced by thermal stress during packaging and in a field application, for example. The triangle-shaped corner region 116 may comprise a width along each side of the integrated circuit die 102 comprising dimension $d_2$, wherein dimension $d_2$ comprises about 80 μm in some embodiments. Alternatively, dimension $d_2$ may comprise other values.

In other embodiments, the corner regions 116 may comprise a shape of a square or a rectangle, as shown in FIG. 13. The square or rectangular-shaped corner region 116 may comprise a width along each side of the integrated circuit die 102 comprising dimension $d_3$, wherein dimension $d_3$ comprises about 80 μm to about 200 μm in some embodiments. Alternatively, dimension $d_3$ may comprise other values. In other embodiments, the corner region 116 may comprise a shape of a triangle with a curved side, as shown in FIG. 14. For example, the curved side may curve outwardly towards an edge of the die 102, as shown in FIG. 14 at 116, or the curved side may curve inwardly away from an edge of the die 102, as shown in FIG. 14 at 116'.

In some embodiments, one or more corner regions 116 or one or more integrated circuit dies 102 packaged using the methods described herein may comprise a corner region 116 having no insulating material 110 disposed thereon that substantially comprises a shape of a triangle, a square, a rectangle, a triangle with a curved side, or a combinations thereof. Alternatively, the corner regions 116 may comprise virtually any other shape, such as a shape of an L, a polygon, a jagged zig-zag edged shape, as examples, combinations thereof, or combinations thereof with the shapes previously mentioned herein.

The connectors 142 and 178 described herein may comprise a eutectic material such as solder, for example. The eutectic material may comprise solder balls or solder paste in some embodiments. The eutectic material is reflowed by heating the eutectic material to a melting temperature of the eutectic material, and the eutectic material is then allowed to cool and re-solidify, forming connectors 142 and 178. The connectors 142 and 178 may include other types of electrical connectors, such as microbumps, controlled collapse chip connection (C4) bumps, or pillars, and may include conductive materials such as Cu, Sn, Ag, Pb, or the like. In some embodiments, the connectors 142 and 178 may comprise joined bumps, as another example.

Figure 15:
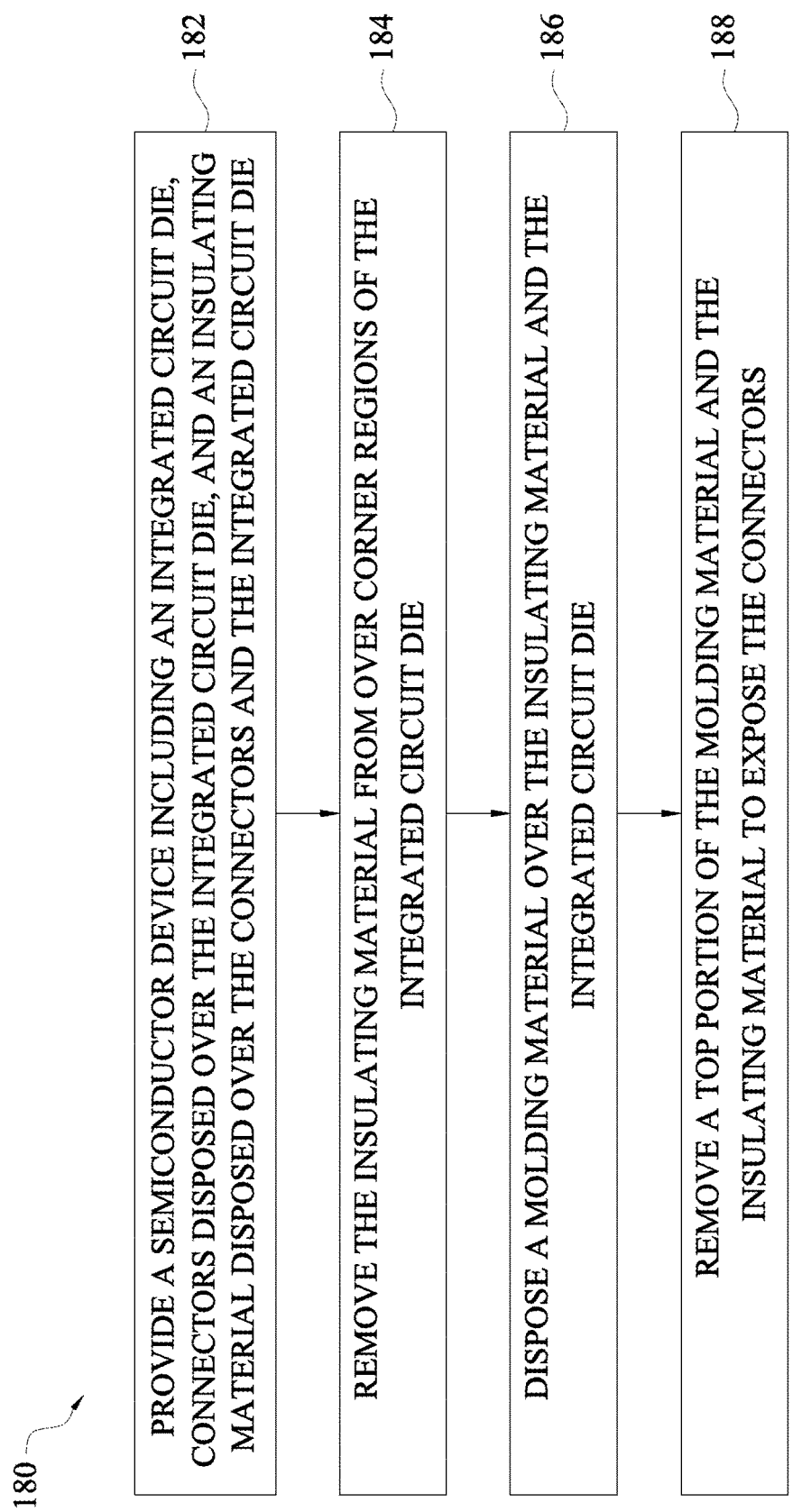
FIG. 15 is a flow chart of a method of packaging a semiconductor device in accordance with some embodiments.

FIG. 15 is a flow chart 180 of a method of packaging semiconductor devices in accordance with some embodiments. In step 182, a semiconductor device comprising an integrated circuit die 102, a plurality of connectors 108 disposed over the integrated circuit die 102, and an insulating material 110 disposed over the plurality of connectors 108 and the integrated circuit die 102 is provided (see also FIG. 1). In step 184, the insulating material 110 is removed from over corner regions 116 of the integrated circuit die 102 (FIG. 3). In step 186, a molding material 124 is disposed over the insulating material 110 and the integrated circuit die 102 (FIG. 5). In step 188, a top portion of the molding material 124 and the insulating material 110 is removed to expose the plurality of connectors 108 (FIG. 6).

Some embodiments of the present disclosure include methods of packaging semiconductor devices. Other embodiments include packaged semiconductor devices that have been packaged using the novel methods described herein.

Some advantages of embodiments of the present disclosure include providing packaging methods that include a novel design for molding material coverage. An insulating material disposed between connectors is removed in corner regions so that the insulating material can be replaced with molding material when the molding material is applied. Including the molding material in the corner regions of integrated circuit dies reduces chip (i.e., integrated circuit die) warpage and protects the chip corners. The chip corners are protected during front side grinding processes by the molding material. The presence of the molding material in the corners advantageously suppresses warpage, reduces grinding marks, and prevents or reduces over-grinding in the chip corners.

The pattern of the insulating material, which comprises a polymer in some embodiments, is revised to have a cleared-out area in the corner regions, which allows the molding material to be applied on. The insulating material coverage range is modified using a photolithography process. Removing the insulating material in the corner regions of the dies can be achieved at a low cost and can be realized in ordinary packaging process flows. A difference in height (e.g., comprising dimension $d_1$ shown in FIG. 6) of connectors across the packaged semiconductor devices is advantageously decreased by implementing embodiments of the present disclosure. Furthermore, the novel packaging methods and structures described herein are easily implementable in manufacturing and packaging process flows.

In some embodiments, a method of packaging a semiconductor device includes providing a semiconductor device comprising an integrated circuit die, a plurality of connectors disposed over the integrated circuit die, and an insulating material disposed over the plurality of connectors and the integrated circuit die. The insulating material is removed from over corner regions of the integrated circuit die, and a molding material is disposed over the insulating material and the integrated circuit die. A top portion of the molding material and the insulating material is removed to expose the plurality of connectors.

In some embodiments, a method of packaging a semiconductor device includes providing a wafer including a plurality of integrated circuit dies, a plurality of connectors disposed over the plurality of integrated circuit dies, and an insulating material disposed over the plurality of connectors and the plurality of integrated circuit dies. The insulating material is removed from corner regions of the plurality of integrated circuit dies using a photolithography process, and the plurality of integrated circuit dies is singulated. One of the plurality of integrated circuit dies is coupled to a carrier, and a molding material is disposed over the insulating material, the one of the plurality of integrated circuit dies, and portions of the carrier. A top portion of the molding material and the insulating material is removed to expose the plurality of connectors.

In other embodiments, a packaged semiconductor device includes an integrated circuit die including a plurality of connectors disposed thereon, and an insulating material disposed between the plurality of connectors over the integrated circuit die, wherein the insulating material is not disposed in corner regions of the integrated circuit die. A molding material is disposed around the integrated circuit die and over the corner regions of the integrated circuit die. An interconnect structure is disposed over the plurality of connectors, the insulating material, and the molding material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of packaging a semiconductor device, the method comprising:
    providing a semiconductor device comprising an integrated circuit die, a plurality of connectors disposed over the integrated circuit die, and an insulating material disposed over the plurality of connectors and the integrated circuit die;
    removing the insulating material from over corner regions of the integrated circuit die;
    after removing the insulating material, disposing a molding material over the insulating material and the integrated circuit die; and
    removing a top portion of the molding material and the insulating material to expose the plurality of connectors.

2. The method according to claim 1, wherein removing the top portion of the molding material and the insulating material comprises a grinding process.

3. The method according to claim 1, further comprising coupling the integrated circuit die to a carrier, before disposing the molding material, and wherein disposing the molding material further comprises disposing the molding material around the integrated circuit die.

4. The method according to claim 1, wherein removing the insulating material from over the corner regions of the integrated circuit die comprises a photolithography process.

5. The method according to claim 1, further comprising forming an interconnect structure over the molding material, the insulating material, and the plurality of connectors, wherein portions of the interconnect structure are coupled to the plurality of connectors.

6. The method according to claim 5, wherein the plurality of connectors comprises a plurality of first connectors, and wherein the method further comprises coupling a plurality of second connectors to the interconnect structure.

7. The method according to claim 5, wherein forming the interconnect structure comprises forming fan-out regions for the plurality of connectors.

8. A method of packaging a semiconductor device, the method comprising:
providing a wafer including a plurality of integrated circuit dies, a plurality of connectors disposed over the plurality of integrated circuit dies, and an insulating material disposed over the plurality of connectors and the plurality of integrated circuit dies;
removing the insulating material from corner regions of the plurality of integrated circuit dies using a photolithography process;
singulating the plurality of integrated circuit dies;
coupling one of the plurality of integrated circuit dies to a carrier;
after removing the insulating material from corner regions, disposing a molding material over the insulating material, the one of the plurality of integrated circuit dies, and portions of the carrier; and
removing a top portion of the molding material and the insulating material to expose the plurality of connectors.

9. The method according to claim 8, wherein removing the insulating material from the corner regions of the plurality of integrated circuit dies comprises exposing a corner stress relief (CSR) pattern, a seal ring, or an alignment mark of the plurality of integrated circuit dies.

10. The method according to claim 8, wherein the one of the plurality of integrated circuit dies comprises a first integrated circuit die, and wherein the method further comprises coupling a second integrated circuit die to the carrier, before disposing the molding material.

11. The method according to claim 8, wherein the method comprises coupling a plurality of the integrated circuit dies to the carrier, before disposing the molding material.

12. The method according to claim 8, wherein the plurality of connectors comprises a plurality of first connectors disposed on a first side of the plurality of integrated circuit dies, and wherein the method further comprises removing the carrier, and coupling a plurality of second connectors to a second side of the one of the plurality of integrated circuit dies, the second side being opposite the first side.

13. A packaged semiconductor device, comprising:
an integrated circuit die including a plurality of connectors disposed thereon;
an insulating material disposed between the plurality of connectors over the integrated circuit die, wherein the insulating material is not disposed in corner regions of the integrated circuit die;
a molding material disposed around the integrated circuit die and over the corner regions of the integrated circuit die, the insulating material interposed between the molding material and the integrated circuit die; and
an interconnect structure disposed over the plurality of connectors, the insulating material, and the molding material.

14. The packaged semiconductor device according to claim 13, wherein the insulating material comprises polybenzoxazole (PBO), polybenzobisoxazole, or polymide.

15. The packaged semiconductor device according to claim 13, wherein the plurality of connectors comprises a plurality of pillars.

16. The packaged semiconductor device according to claim 15, wherein the plurality of pillars comprises copper or a copper alloy.

17. The packaged semiconductor device according to claim 13, wherein the corner regions substantially comprise a shape selected from the group consisting essentially of a triangle, a square, a rectangle, a triangle with a curved side, and combinations thereof.

18. The packaged semiconductor device according to claim 17, wherein the corner regions comprise a shape of a triangle, and wherein the triangle comprises an isosceles right triangle.

19. The packaged semiconductor device according to claim 13, wherein the integrated circuit die comprises a plurality of contact pads disposed thereon, and wherein each of the plurality of connectors is coupled to one of the plurality of contact pads.

20. The packaged semiconductor device according to claim 13, wherein the plurality of connectors comprises a plurality of first connectors, wherein the packaged semiconductor device comprises a first packaged semiconductor device, and wherein the first packaged semiconductor device is coupled to a second packaged semiconductor device by a plurality of second connectors.

* * * * *